United States Patent
Chae et al.

(10) Patent No.: US 7,572,736 B2
(45) Date of Patent: Aug. 11, 2009

(54) METHOD OF DRY-ETCHING SEMICONDUCTOR DEVICES

(75) Inventors: Yun-Sook Chae, Suwon (KR); Ji-Soo Kim, Yongin (KR); Chang-jin Kang, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1337 days.

(21) Appl. No.: 10/261,595

(22) Filed: Sep. 30, 2002

(65) Prior Publication Data

US 2004/0063327 A1  Apr. 1, 2004

(30) Foreign Application Priority Data

Sep. 29, 2001  (KR) ............................... 2001-60997

(51) Int. Cl.
*H01L 21/302* (2006.01)
(52) U.S. Cl. .................. 438/714; 438/706; 438/715; 134/1.1
(58) Field of Classification Search ................ 438/694, 438/706, 712, 714, 715; 134/1.1, 1.2
See application file for complete search history.

(56) References Cited

U.S. PATENT DOCUMENTS

| | | | | |
|---|---|---|---|---|
| 5,571,366 A * | 11/1996 | Ishii et al. | ............... | 156/345.26 |
| 5,885,902 A * | 3/1999 | Blasingame et al. | ......... | 438/738 |
| 6,100,010 A * | 8/2000 | Ina | .......................... | 430/273.1 |
| 6,107,135 A * | 8/2000 | Kleinhenz et al. | ........... | 438/249 |
| 6,177,341 B1 * | 1/2001 | Lai | ............................. | 438/637 |
| 6,207,583 B1 * | 3/2001 | Dunne et al. | ................. | 438/725 |
| 6,221,772 B1 * | 4/2001 | Yang et al. | ................... | 438/689 |
| 6,221,776 B1 * | 4/2001 | Smith | .......................... | 438/692 |
| 6,367,347 B1 * | 4/2002 | Blaschke et al. | ........... | 74/502.2 |
| 6,376,347 B1 * | 4/2002 | Ohmura et al. | ............. | 438/585 |
| 6,649,532 B1 * | 11/2003 | Chen et al. | ................... | 438/714 |
| 2001/0008124 A1 * | 7/2001 | Jiwari et al. | ................ | 118/728 |
| 2002/0072009 A1 * | 6/2002 | Kim et al. | ................ | 430/270.1 |
| 2003/0068898 A1 * | 4/2003 | Lee et al. | .................... | 438/712 |
| 2003/0159307 A1 * | 8/2003 | Sago et al. | .................... | 34/107 |

FOREIGN PATENT DOCUMENTS

JP          06140187 A  *  5/1994

OTHER PUBLICATIONS

Kurita et al., Plasma Treatment Device, May 20, 1994, English Abstract and Computer translation into English of JP 06140187 A, 6 pages.*
Japanese Patent Publication No. Hei 10-199789 (Jul. 31, 1998). (English Abstract).

* cited by examiner

*Primary Examiner*—Lan Vinh
(74) *Attorney, Agent, or Firm*—F. Chau & Associates, LLC

(57) ABSTRACT

A system, method and product of dry-etching a semiconductor device are disclosed, the system having a material supply for forming a material layer on the semiconductor substrate, a pattern for disposing at least one photoresist pattern on the material layer, a dry-etching chamber for housing a dry-etching process of the material layer, a chiller for adjusting the temperature of the chamber, the semiconductor substrate, the material layer and/or the photoresist for the dry-etching process, a stage for loading the semiconductor substrate in the dry-etching chamber, and a dry-etchant supply for dry-etching the material layer while the integrity of the photoresist pattern is enhanced by the adjusted temperature.

24 Claims, 4 Drawing Sheets

METHOD OF DRY-ETCHING SEMICONDUCTOR DEVICES

BACKGROUND OF THE INVENTION

1. Field of the Invention

The present invention relates to a method of dry-etching semiconductor devices, and more particularly, to a method of dry-etching using a photoresist suitable for ArF as an etching mask.

2. Description of the Related Art

Material layers having a variety of electrical characteristics, such as, for example, conductive layers, semiconductor layers, and insulating layers, are formed on a semiconductor substrate. Next, the material layers are each patterned according to predesigned circuits. As a result, semiconductor integrated circuits are manufactured.

The patterning of the material layers is performed by a photolithography process. In other words, a photoresist layer, which later undergoes a photochemical reaction, is formed on particular material layers to be patterned. Next, a photo mask or a reticle in which a transfer image is already formed is positioned on a semiconductor substrate on which the photoresist layer is formed. When the photoresist layer is exposed to light having a particular wavelength, a photochemical reaction occurs at particular portions of the photoresist layer. Next, portions at which a photochemical reaction occurs or does not are removed, according to the kind of photoresist used with a developer, to thereby form photoresist patterns. The particular material layers are etched and patterned using the photoresist patterns as an etching mask. The photolithography process becomes more important as the design rule is reduced in the trend toward higher integration semiconductor integrated circuits.

Photoresist suitable for KrF, which is supplied using a KrF excimer laser having an exposure wavelength of 248 nm as an exposure light source, is used in a photolithography process for forming patterns of 0.18 μm according to a design rule. When the design rule in a photolithography process results in forming patterns of 0.13 μm according to the high integration density of semiconductor devices, the size of patterns is about half of the KrF wavelength. Thus, preferred pattern profiles can not be secured due to a limit in resolution on patterns having a size equal to or smaller than about half of a KrF wavelength. Therefore, a photolithography process for forming patterns of 0.13 μm inevitably uses a combination of a KrF technique and an ultraresolution technique such as a half-tone illumination technique, a phase shift mask ("PSM") technique, and an optical proximity correction ("OPC") technique.

The KrF-based technique used with the ultraresolution technique is applied up to a line width of 0.11 μm, but reaches its limit in a line width of 0.10 μm due to a sharp increase in the time required for manufacturing mask patterns and an increase in the development costs. Thus, an ArF excimer laser having an exposure wavelength of 193 nm is introduced to an exposure technique.

However, the ArF technique has the following problems. First, when a photolithography process is performed using photoresist suitable for ArF, a light source having a short wavelength of 193 nm is used in an exposure equipment to increase resolution. Here, the light source with the short wavelength has poor transmissivity with respect to photoresist and thus thins the thickness of the photoresist.

Second, photoresist suitable for ArF has lower carbon content and higher oxygen content than photoresist suitable for KrF. Thus, the resistance of a photoresist suitable for ArF to dry-etching is remarkably reduced compared to a photoresist suitable for KrF.

Third, in a KrF-suitable photoresist process, an inorganic anti-reflective layer having an excellent adhesion to the KrF-suitable photoresist is used as an anti-reflective layer whereas an organic anti-reflective layer is used as anti-reflective layer in an ArF-suitable photoresist process. However, since an organic anti-reflective layer is formed of a hydrocarbon polymer similar to the photoresist, it is very difficult to maintain high etch selectivity during dry-etching. Thus, the ArF-suitable photoresist process requires much higher photoresist selectivity, i.e., higher resistance to dry-etching, than the KrF-suitable photoresist during dry-etching.

Accordingly, if materials to be etched are etched by a general dry-etching method using an ArF-suitable photoresist, patterns becomes wiggled (so-called "wiggling phenomenon"), or upper portions or sides of patterns are striated (so-called "striaton phenomenon"), or patterns are fallen down due to the lack of resistance of the ArF-suitable photoresist to dry-etching. As a result, it is difficult to form the desired patterns. In particular, if ArF-suitable photoresist patterns are used in a process using silicon nitride having a thickness of about 2,000 Å as a hard mask formed on gate lines or bit lines of semiconductor DRAMs, this problem becomes more serious.

Therefore, the development of a new etching method is required in order to form the desired patterns in an ArF process introduced to cope with a reduction in the design rule accompanying the high integration density of semiconductor devices.

SUMMARY OF THE INVENTION

To address the above-described problems and disadvantages, it is a first advantage of the present invention to provide a method of dry-etching a semiconductor device in which the wiggling, striation, or falling down of patterns does not occur when the patterns are formed using ArF-suitable photoresist patterns as an etching mask.

It is a second advantage of the present invention to provide a method of dry-etching a semiconductor device in which the wiggling, striation, or falling down of patterns does not occur in a photolithography process using an ArF excimer laser having a short wavelength that is equal to or less than 193 nm.

Accordingly, to achieve the first advantage, there is provided a method of dry-etching a semiconductor device. A material layer to be etched is formed on a semiconductor substrate. Photoresist patterns are formed on the material layer using photoresist suitable for an exposure light source having a wavelength equal to or less than 193 nm. The semiconductor substrate, on which the photoresist patterns are formed, is loaded on a stage in a dry-etching chamber. The material layer is dry-etched with lowering the temperature of the semiconductor substrate to be equal to or lower than a predetermined temperature.

Organic anti-reflective layers may further be formed on the material layer before forming the photoresist patterns. An exposure process may be performed using an exposure light source having a wavelength equal to or less than 193 nm in the step of forming the photoresist patterns.

The stage includes a chiller, and lowering the temperature of the semiconductor substrate is performed in the step of etching the material layer by controlling the set temperature of the chiller. Preferably, the temperature of the chiller is set within a range of −20 to 5° C. The temperature of the semiconductor substrate may be maintained at a temperature that is equal to or lower than 35° C. to dry-etch the material layer.

When dry-etching the material layer with lowering the temperature of the semiconductor substrate, the semiconductor substrate may be unloaded from the dry-etching chamber during the step of dry-etching process, the inside of the dry-etching chamber may be purged with a purge gas, and the semiconductor substrate may be loaded into the dry-etching chamber to etch the material layer.

The temperature of the semiconductor substrate may be lowered by increasing the flow rate of an inert gas into the dry-etching chamber in a step of stabilizing the semiconductor substrate during the step of etching the material layer.

To achieve the second advantage, there is provided a method of dry-etching a semiconductor device. A conductive material layer is formed on a semiconductor substrate. A silicon nitride layer is formed on the conductive layer. Anti-reflective layers are formed on the silicon nitride layer. ArF-suitable photoresist patterns are formed on the anti-reflective layers. The semiconductor substrate on which the photoresist patterns are formed is loaded on a stage in a dry-etching chamber. The anti-reflective layers and the silicon nitride layer are dry-etched using the photoresist patterns as an etching mask with lowering the semiconductor substrate to be equal to or lower than a predetermined temperature.

Lowering the temperature of the semiconductor substrate may be performed in the step of dry-etching the anti-reflective layers and the silicon nitride layer by controlling the set temperature of the chiller. When dry-etching the anti-reflective layers and the silicon nitride layer with lowering the temperature of the semiconductor substrate, the semiconductor substrate may be unloaded from the dry-etching chamber during the step of the dry-etching process, the inside of the dry-etching chamber may be purged with a purge gas, and the semiconductor substrate may be loaded into the dry-etching chamber to dry-etch the anti-reflective layers and the silicon nitride layer. The temperature of the semiconductor substrate may be lowered by increasing the flow rate of an inert gas into the dry-etching chamber in a step of stabilizing the semiconductor substrate during the step of dry-etching the anti-reflective layers and the silicon nitride layer.

It is preferable that a photoresist of the ArF-suitable photoresist patterns have an ohnish parameter that is equal to or more than 3.2. A polysilicon layer and a tungsten silicide layer may constitute the conductive material layer. Here, the anti-reflective layers are etched using an etch gas containing $O_2$ and $CF_4$. It is preferable that the silicon nitride layer is etched using an etch gas containing $O_2$, $CF_4$, $CFH_3$, and Ar.

According to the present invention, an etching process is performed at a low temperature equal to or lower than a predetermined temperature using ArF-suitable photoresist patterns having a poor dry-etching resistance. As a result, the resistance to the dry-etching of the photoresist patterns is remarkably strengthened, and the wiggling, striation, or falling down of the photoresist patterns is prevented. Thus, excellent etch patterns can be obtained.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF PREFERRED EMBODIMENTS

Figure 1:
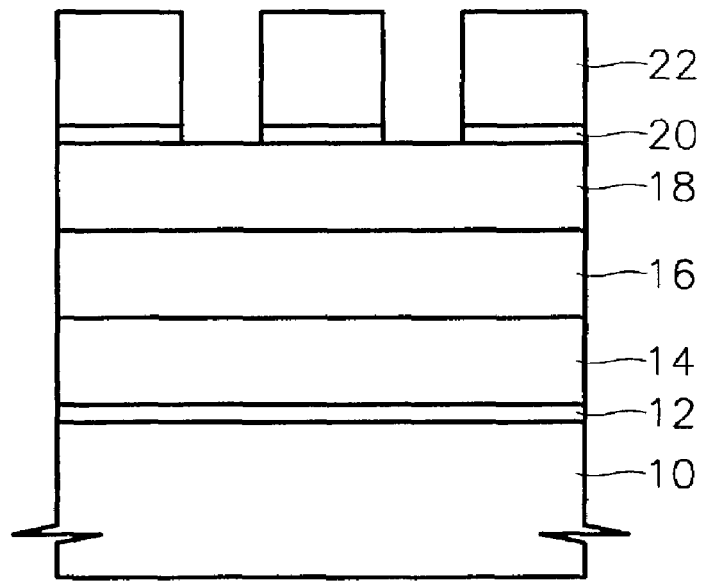
FIGS. 1 and 2 are cross-sectional diagrams explaining a method of dry-etching a semiconductor device according to the present invention.

A method of dry-etching a semiconductor device is provided, in which the wiggling, striation, or falling down of patterns does not occur when the patterns are formed using ArF-suitable photoresist patterns as an etching mask. In the method, a material layer to be etched is formed on a semiconductor substrate. Photoresist patterns are formed on the material layer using photoresist suitable for an exposure light source having a wavelength equal to or less than 193 nm. The semiconductor substrate, on which the photoresist patterns are formed, is loaded on a stage in a dry-etching chamber. The material layer is dry-etched with lowering the temperature of the semiconductor substrate to be equal to or lower than a predetermined temperature. The semiconductor substrate is at a low temperature in the step of etching the material layer by setting the temperature of a chiller, which is connected to the stage, for controlling the temperature of a coolant cooling the stage to −20 to 5 ° C.

Hereinafter, exemplary embodiments of the present invention will be described in detail with reference to the attached drawings. However, the embodiments of the present invention can be modified into various other forms, and the scope of the present invention must not be interpreted as being restricted to these embodiments. The embodiments are provided to more completely explain the present invention to those skilled in the art. In drawings, the thicknesses of layers or regions may be exaggerated for clarity. Like reference numerals in the drawings denote like members. In addition, when it is written that a layer is formed "on" another layer or a substrate, the layer can be formed directly on the other layer or the substrate, or other layers can intervene therebetween.

In this embodiment, a dry-etching method is applied to a process for forming gate lines of a semiconductor dynamic random access memory ("DRAM") to show the resistance of ArF-suitable photoresist to etching, but the method is not restricted to only this purpose, process or embodiment.

Figure 2:
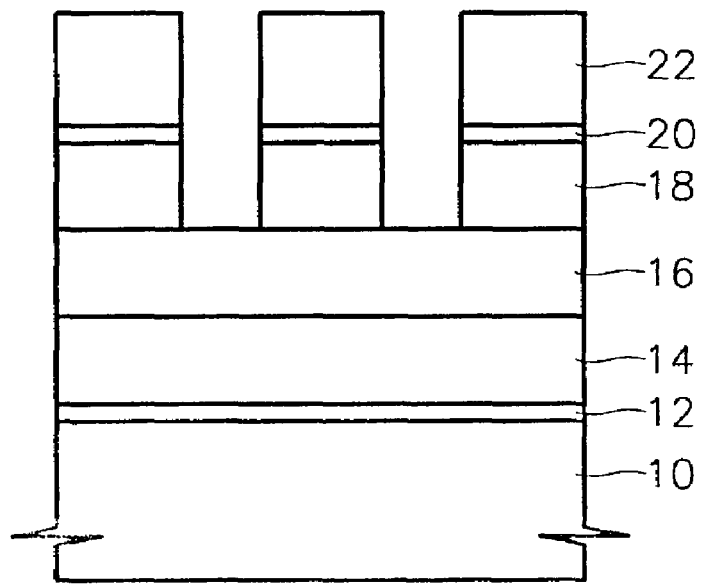

FIGS. 1 and 2 are cross-sectional diagrams explaining a method of dry-etching a semiconductor device according to the present invention.

Referring to FIG. 1, a conductive material layer, which will be used as a gate line, is formed on a gate oxide layer 12 formed on a semiconductor substrate 10 made of silicon. In this embodiment, a polysilicon layer 14 and a tungsten silicide layer 16 constitute the conductive material layer. The polysilicon layer 14 is formed to a thickness of about 800 Å, and the tungsten silicide layer 16 is formed to a thickness of about 1,000 Å.

A silicon nitride layer 18, which serves as a hard mask during an etching process, is formed to a thickness of about 2,000 Å on the tungsten silicide layer 16. Organic anti-reflective layers 20, which serve as anti-reflective layers for photoresist layers during a photolithography process, are formed to a thickness of about 600 Å on the silicon nitride layer 18.

The organic anti-reflective layers 20 are coated with ArF photoresist layers 22 having a thickness of about 3,000 Å. The ArF photoresist layers 22 may be formed of a photoresist, which is to be applied to a photolithography process using an ArF excimer laser having an exposure wavelength of 193 nm as an exposure light source. For example, a brand name photoresist material, SASK68C2, having a glass temperature ("Tg") within a range of 170 to 180° C. and an ohnish parameter of 3.2, or another brand name photoresist material, PAR-101, having a glass temperature within a range of 170 to 180° C. and an ohnish parameter of 3.7, may be used. Here, the ohnish parameter is a function of the difference between the number of carbon atoms and the number of oxygen atoms among the total number of atoms of a photoresist material.

The semiconductor substrate 10 on which the ArF photoresist layers 22 are formed is transferred to exposure equipment. Next, a general exposure process is performed on the ArF photoresist layers 22 using an ArF excimer laser having an exposure wavelength of 193 nm, and exposed portions are removed using a developer. As a result, photoresist patterns having lines and spaces are formed, as shown in FIG. 1.

The semiconductor substrate 10 on which the photoresist patterns are formed is loaded into a dry-etching chamber at a predetermined pressure, and then a dry-etching process is performed using the photoresist patterns as an etching mask. The dry-etching chamber of this embodiment includes a stage on which the semiconductor substrate 10 is loaded and mounted. The stage is connected to a chiller for controlling the temperature of a coolant cooling the stage. The chiller is connected to a coolant line formed in the stage and a source supplying cooling water from outside the dry-etching chamber and maintains the temperature of the semiconductor substrate 10 to be at less than a predetermined temperature, as described hereinafter, during the dry-etching process.

FIG. 1 shows the steps of etching the anti-reflective layers 20 using the photoresist patterns as an etching mask. The etching process for the anti-reflective layers 20 is performed in the dry-etching chamber at a pressure of 240 mTorr for 75 seconds using an etch gas containing 6 sccm of $O_2$, 40 sccm of $CF_4$, and 800 sccm of Ar. Here, an overetching process by about 50% is performed.

A process for stabilizing an etching process is performed in order to change conditions, such as an etch gas, by blocking the supply of the etch gas before the silicon nitride layer 18 is etched. For example, the stabilization process may be performed by supplying an inert gas such as argon.

Referring to FIG. 2, the silicon nitride layer 18 is etched using the photoresist patterns as an etching mask. The etching process for the silicon nitride layer 18 is performed in the dry-etching chamber at a pressure of 240 mTorr using an etch gas containing 8 sccm of $O_2$, 10 sccm of $CF_4$, 30 sccm of $CHF_3$, and 800 sccm of Ar. The overetching is performed by about 40% beyond an etch detection point.

For this embodiment, an experiment was made during the etching processes for the anti-reflective layers 20 and the silicon nitride layer 18 by variously setting the temperatures of the chiller connected to the stage on which the semiconductor substrate 10 is mounted in order to observe the resistance of the photoresist patterns to etching in relation with the temperature. The results are shown in FIGS. 3 through 8.

Figure 3:
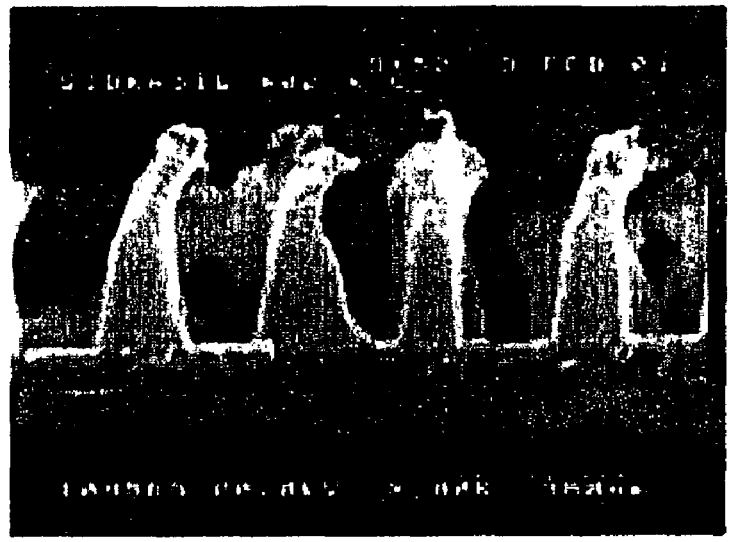
FIGS. 3 and 4 are scanning electron microscope photos of patterns formed by a conventional dry-etching method.
Figure 4:
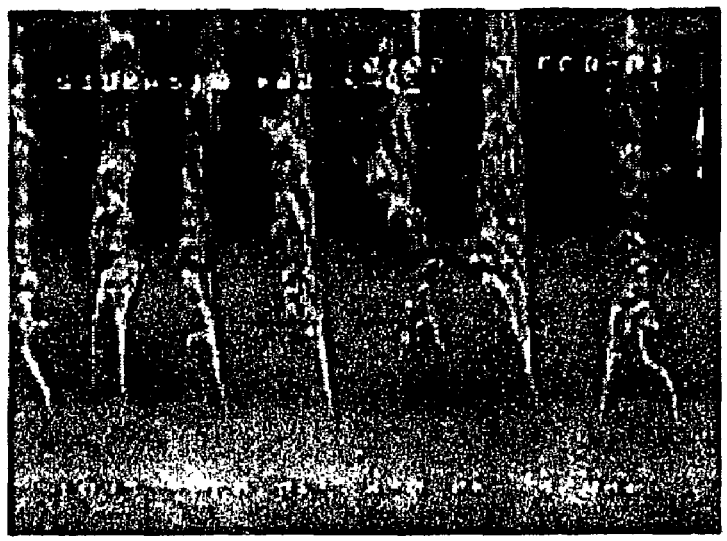

FIGS. 3 and 4 are scanning electron microscope photos patterns after the temperature of the chiller is set to a normal temperature, i.e., 20° C., during an effectively conventional dry-etching process and etching of the anti-reflective layers 20 and the silicon nitride layer 18. FIG. 3 is a side view of the patterns, and FIG. 4 is an elevated side view of the patterns. In FIGS. 3 and 4, it can be seen that the photoresist patterns are wiggled due to a sharp reduction in the resistance of the ArF-suitable photoresist for etching, that upper portions or sides of the photoresist patterns are striated due to a reaction to radicals or ions, or that the photoresist patterns are fallen down if an etching process is performed at a normal or conventional temperature.

Figure 5:
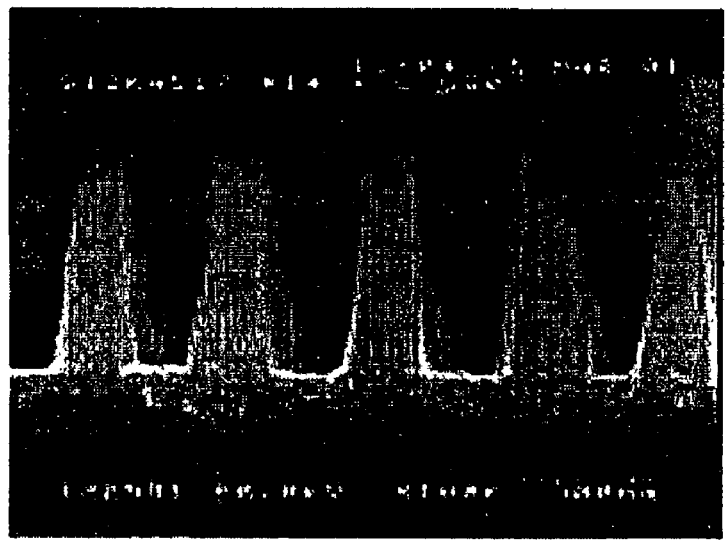
FIGS. 5 through 8 are scanning electron microscope photos of patterns formed by a dry-etching method according to the present invention.
Figure 6:
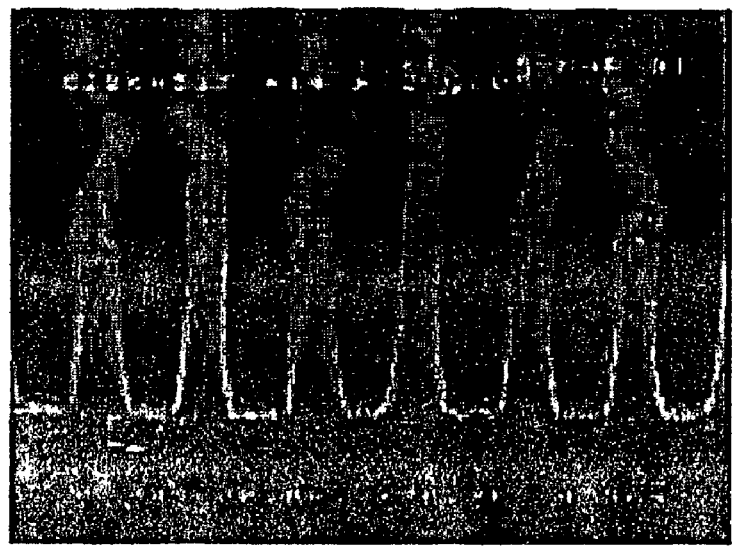

FIGS. 5 and 6 are scanning electron microscope photos of patterns after the temperature of the chiller is set to 5° C. and the anti-reflective layers 20 and the silicon nitride layer 18 are etched. FIG. 5 is a side view of the patterns, and FIG. 6 is an elevated side view of the patterns. In FIGS. 5 and 6, it can be seen that the wiggling, striation, and falling down of the patterns generated are remarkably reduced.

Figure 7:
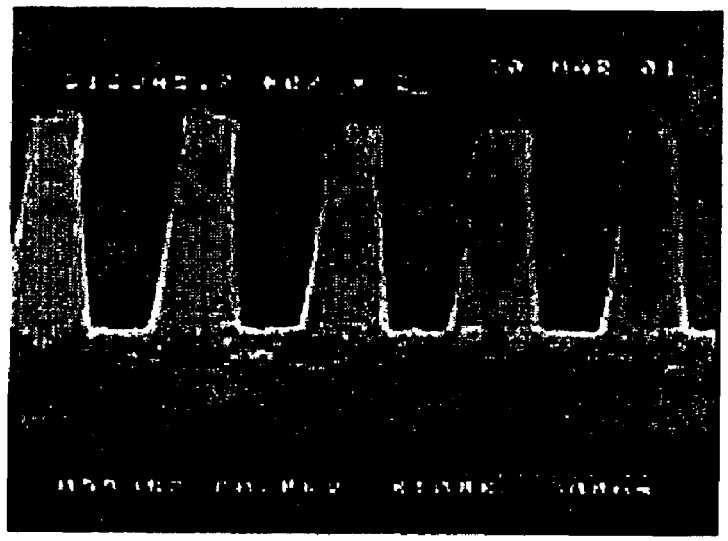
Figure 8:
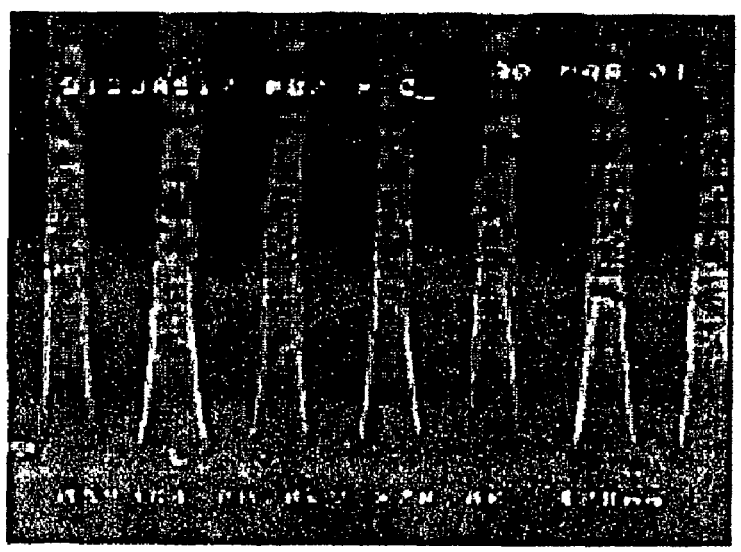

FIGS. 7 and 8 are scanning electron microscope photos of patterns after the temperature of the chiller is set to −10° C. and the anti-reflective layers 20 and the silicon nitride layer 18 are etched. FIG. 7 is a side view of the patterns, and FIG. 8 is an elevated side view of the patterns. In FIGS. 7 and 8, it can be seen that the wiggling, striation, and falling down of the patterns generated are remarkably reduced, and the pattern profiles are even better than in the case where the temperature of the chiller is set to 5° C.

In this embodiment, experiments where the temperature of the chiller was set to a normal temperature, i.e., 20° C., and to temperatures equal to or less than 20° C. were conducted. The wiggling and striation of pattern profiles still substantially occurred if the temperature of the chiller is set to a temperature higher than 5° C. The resistance of photoresist patterns to etching is strengthened if the temperature of the chiller is set to a temperature equal to or lower than 5° C., thereby obtaining excellent pattern profiles.

The resistance of photoresist to etching is strengthened if the temperature of the chiller is set to a low temperature. Positively sloping patterns occur if the temperature of the chiller is set to a temperature equal to or lower than a predetermined temperature. Excellent pattern profiles are obtained by controlling the chemistry of etch gases or the time for overetching. However, the occurrence of positively sloping patterns is too excessive if the temperature of the chiller is set to a very low temperature equal to or less than −20° C., and it then becomes very difficult to obtain excellent pattern profiles.

In this embodiment, experiments were conducted to test the relationship between the set temperature of the chiller and the resistance of photoresist patterns to etching. The relationship between set the temperature of the chiller and the temperature of the semiconductor substrate 10 mounted on the stage may also be understood by the same concept. In general, the temperature of the semiconductor substrate 10 mounted on the stage is about 30° C. higher than the temperature of the chiller during an etching process. Thus, almost the same pattern profiles are obtained if the anti-reflective layers 20 and the silicon nitride layer 18 are etched while maintaining the temperature of the semiconductor substrate 10 at a temperature equal to or lower than about 35° C.

As described above, in this embodiment, setting the temperature to a low temperature in a dry-etching step was explained previously when describing setting the temperature of the chiller, but the lowering of each temperature may be realized in various other forms.

For example, as described previously, the temperature in an etch chamber may be lowered by increasing the flow rate of an inert gas, such as argon, in the stabilization process between the etching process of the anti-reflective layers 20 and the etching process of the silicon nitride layer 18. In another example, a semiconductor substrate is unloaded from the etch chamber during an etching process, purge gas is supplied into the etch chamber, and the temperature in the etch chamber is lowered. Next, the etching process may continue after the semiconductor substrate is loaded into the etch chamber again.

A step of forming a gate line of a semiconductor DRAM is applied to this embodiment in order to observe the resistance of ArF-suitable photoresist to etching. However, the present invention may be applied to a variety of steps of manufacturing a semiconductor device, such as a step of forming a bit line, for example.

Moreover, ArF-suitable photoresist is used in this embodiment. However, the present invention may be applied to a process having an exposure wavelength equal to or less than 193 nm, such as, for example, a $F_2$ process using a short wavelength of 157 nm, which has been developed as a next-generation photolithography technique.

According to the present invention, an etching process is performed at a low temperature equal to or lower than a predetermined temperature using ArF-suitable photoresist patterns having a poor dry-etching resistance. As a result, the resistance to the dry-etching of the photoresist patterns is remarkably strengthened, and the wiggling, striation, or falling down of the photoresist patterns is prevented. Thus, excellent etch patterns can be obtained to secure high integration density profiles.

These and other features and advantages of the present disclosure may be readily ascertained by one of ordinary skill in the pertinent art based on the teachings herein. Although illustrative embodiments have been described herein with reference to the accompanying drawings, it is to be understood that the present disclosure is not limited to those precise embodiments, and that various changes and modifications may be effected therein by one of ordinary skill in the pertinent art without departing from the scope or spirit of the present disclosure. All such changes and modifications are intended to be included within the scope of the present disclosure as set forth in the appended claims.

What is claimed is:

1. A method of dry-etching a semiconductor device, the method comprising:
   forming a material layer to be etched on a semiconductor substrate;
   forming photoresist patterns on the material layer using photoresist suitable for an exposure light source having a wavelength equal to or less than about 193 nm
   loading the semiconductor substrate, on which the photoresist patterns are formed, on a stage in a dry-etching chamber; and
   dry-etching the material layer with lowering the temperature of the semiconductor substrate to be equal to or lower than a predetermined temperature,
   wherein dry-etching the material layer with lowering the temperature of the semiconductor substrate comprises:
   unloading the semiconductor substrate from the dry-etching chamber during the step of dry-etching process;
   purging the inside of the dry-etching chamber with a purge gas; and
   loading the unloaded semiconductor substrate into the dry-etching chamber to etch the material layer.

2. The method of claim 1, wherein an exposure process is performed using an exposure light source having a wavelength equal to or less than about 193 nm in the step of forming the photoresist patterns.

3. The method of claim 1, further comprising forming organic anti-reflective layers on the material layer before forming the photoresist patterns.

4. The method of claim 1, wherein the temperature of the semiconductor substrate is lowered by increasing the flow rate of an inert gas into an area of the dry-etching chamber which is exposed to a dry-etching gas in a step of stabilizing the semiconductor substrate during the dry-etching.

5. The method of claim 1, wherein the stage comprises a chiller, and lowering the temperature of the semiconductor substrate is performed in the step of etching the material layer by controlling the set temperature of the chiller.

6. The method of claim 5, wherein the temperature of the chiller is set within a range of about −20° C. to about 5° C.

7. The method of claim 5, wherein the temperature of the semiconductor substrate is maintained at a temperature equal to or lower than about 35° C. to dry-etch the material layer.

8. A method of dry-etching a semiconductor device, the method comprising:
   forming a conductive material layer on a semiconductor substrate;
   forming a silicon nitride layer on the conductive layer;
   forming anti-reflective layers on the silicon nitride layer;
   forming ArF-suitable photoresist patterns on the anti-reflective layers;
   loading the semiconductor substrate on which the photoresist patterns are formed on a stage in a dry-etching chamber; and
   dry-etching the anti-reflective layers and the silicon nitride layer using the photoresist patterns as an etching mask with lowering the temperature of the semiconductor substrate to be equal to or lower than a predetermined temperature,
   wherein dry-etching the anti-reflective layers and the silicon nitride layer with lowering the temperature of the semiconductor substrate comprises:
   unloading the semiconductor substrate from the dry-etching chamber during the step of dry-etching process;
   purging the inside of the dry-etching chamber with a purge gas; and
   loading the unloaded semiconductor substrate into the dry-etching chamber to etch the anti-reflective layers and the silicon nitride layer.

9. The method of claim 8, wherein the stage is connected to a chiller for controlling the temperature of a coolant cooling the stage, and lowering the temperature of the semiconductor substrate is performed in the step of dry-etching the anti-reflective layers and the silicon nitride layer by controlling the set temperature of the chiller.

10. The method of claim 9, wherein the temperature of the chiller is set within a range of about −20 to about 5° C.

11. The method of claim 8, wherein the temperature of the semiconductor substrate is maintained at a temperature equal to or less than 35° C. to etch the anti-reflective layers and the silicon nitride layer.

12. The method of claim 8, wherein the temperature of the semiconductor substrate is lowered by increasing the flow rate of an inert gas into the dry-etching chamber in a step of stabilizing the semiconductor substrate during the step of dry-etching the anti-reflective layers and the silicon nitride layer.

13. The method of claim 8, wherein a photoresist of the ArF-suitable photoresist patterns have an ohnish parameter that is equal to or more than 3.2.

14. The method of claim 8, wherein a photoresist of the ArF-suitable photoresist patterns are formed to a thickness of 3,000-4,000 Å.

15. The method of claim 14, wherein the silicon nitride layer is formed of a thickness of 2,000 Å or more.

16. The method of claim 8, wherein a polysilicon layer and a tungsten silicide layer constitute the conductive material layer.

17. The method of claim 16, wherein the anti-reflective layers are etched using an etch gas containing $O_2$ and $CF_4$.

18. The method of claim 16, wherein the silicon nitride layer is etched using an etch gas containing $O_2$, $CF_4$, $CFH_3$, and Ar.

19. A method of processing a semiconductor device in a dry-etching chamber, the method comprising:
providing a semiconductor substrate;
forming a material layer on the semiconductor substrate;
disposing at least one photoresist pattern on the material layer;
adjusting the temperature of at least one of the chamber, the semiconductor substrate, the material layer and the photoresist;
loading the semiconductor substrate in the dry-etching chamber; and
dry-etching the material layer while the integrity of the photoresist pattern is enhanced by the adjusted temperature,
wherein dry-etching the material layer comprises:
unloading the semiconductor substrate from the dry-etching chamber during the step of dry-etching process;
purging the inside of the dry-etching chamber with a purge gas; and
loading the unloaded semiconductor substrate into the dry-etching chamber to etch the material layer.

20. A method as defined in claim 19 wherein one of said at least one photoresist pattern is responsive to an exposure light wavelength less than about 194 nm.

21. A method as defined in claim 19, further comprising maintaining the temperature of at least one of the chamber, the semiconductor substrate, the material layer and the photoresist within a predetermined range during the step of dry-etching.

22. A method as defined in claim 21 wherein said predetermined range is within about negative 20 degrees Celsius to about positive 5 degrees Celsius.

23. A method as defined in claim 19, further comprising:
mounting the semiconductor substrate on a stage; and
chilling the semiconductor substrate by chilling the stage.

24. A method as defined in claim 23 wherein chilling the stage to a temperature range of about negative 20 degrees Celsius to about positive 5 degrees Celsius chills the semiconductor substrate to less than about positive 35 degrees Celsius.

* * * * *